United States Patent [19]

Kohno

[11] Patent Number: 4,997,779

[45] Date of Patent: Mar. 5, 1991

[54] METHOD OF MAKING ASYMMETRICAL GATE FIELD EFFECT TRANSISTOR

[75] Inventor: Yasutaka Kohno, Itami, Japan

[73] Assignee: Mitsubishi Denki Kabushiki Kaisha, Japan

[21] Appl. No.: 357,536

[22] Filed: May 26, 1989

[30] Foreign Application Priority Data

Jun. 13, 1988 [JP] Japan .................................. 63-146278

[51] Int. Cl.⁵ ............................................. H01L 21/70
[52] U.S. Cl. .......................................... 437/41; 437/39;
437/40; 437/184; 437/228; 437/235
[58] Field of Search ...................... 437/39, 40, 41, 184,
437/228, 235; 557/15

[56] References Cited

U.S. PATENT DOCUMENTS

| 4,232,439 | 11/1980 | Shibata | 437/39 |
| 4,532,698 | 8/1985 | Fang et al. | 437/40 |
| 4,559,693 | 12/1985 | Kamei | 437/39 |

FOREIGN PATENT DOCUMENTS 0132363  6/1987  Japan .................................... 437/40

Primary Examiner—Brian E. Hearn
Assistant Examiner—T. Thomas
Attorney, Agent, or Firm—Leydig, Voit & Mayer

[57] ABSTRACT

A field effect transistor includes a high concentration doping layer self-alignedly produced using a refractory metal silicide gate as a mask for ion implantation in a semi-insulating substrate. The distance between the refractory metal gate and the high concentration doping layer which becomes a source region is shorter than the distance between the refractory metal gate and a high concentration doping layer which becomes a drain region.

A method of producing a field effect transistor having an offset refractory metal silicide gate includes depositing a refractory metal silicide layer, a refractory metal film, and a first insulator film successively on an active layer which is produced on a semi-insulating substate. The deposited layers are patterned with a resist film for producing a gate pattern mask for etching the respective layers all at once or one-by-one. High dopant concentration source and drain regions are formed by ion implantation and annealing. A second insulator film is deposited on the entire surface of the substrate. The structure is etched to leave the second insulator film only at one side of the gate using reactive ion etching oblique to the substrate. Alternatively, the second insulator film is deposited to cover only one of the sides of the gate on the substrate. Etching is carried out at only one side of the refractory metal silicide film using the first and second insulator films as masks. Source and drain electrodes are formed after removing the first and second insulator films.

4 Claims, 13 Drawing Sheets

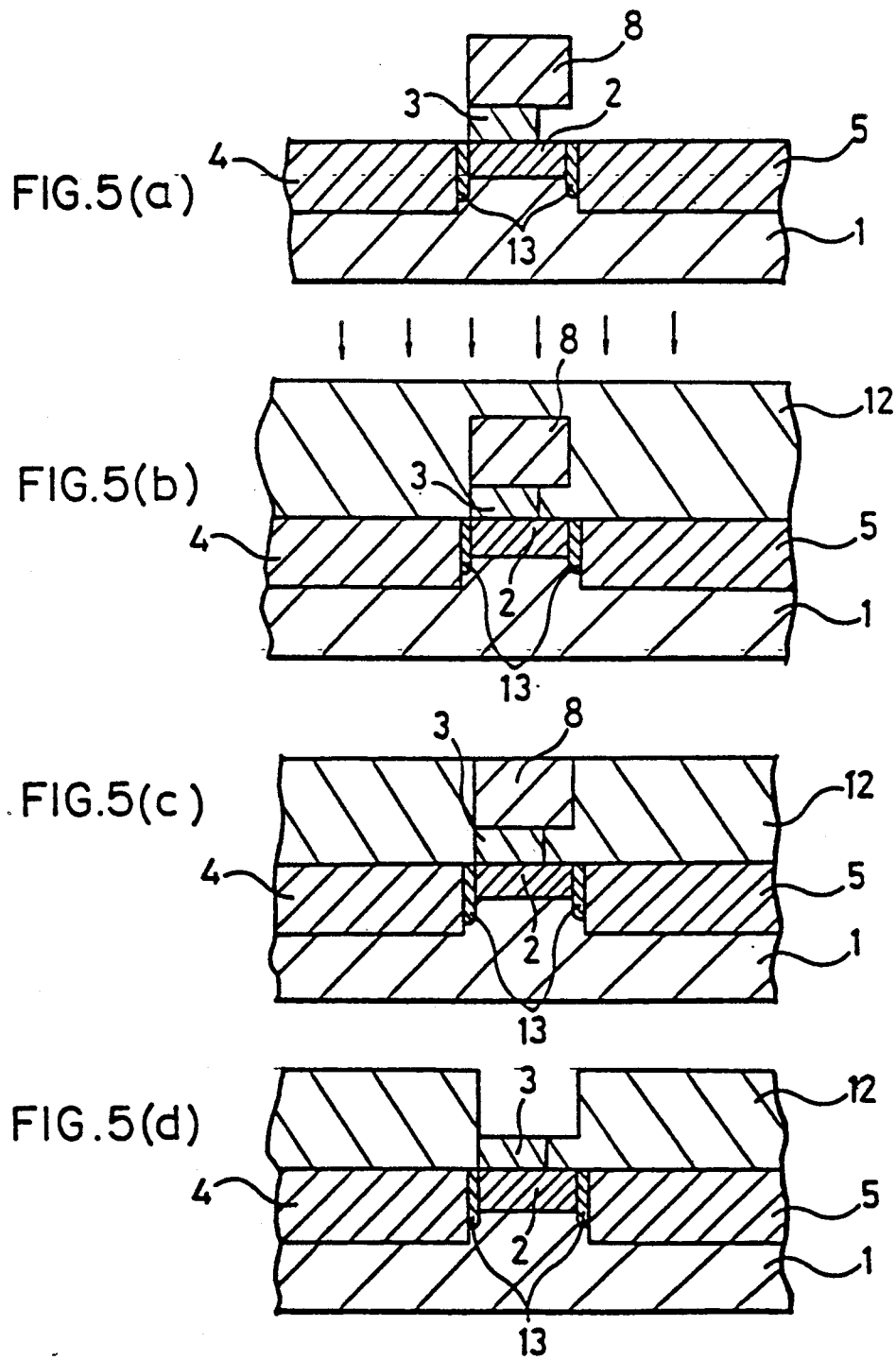

$I_{ds} = y_m V_c$
$y_m = g_m e^{-i\omega\tau_0}$

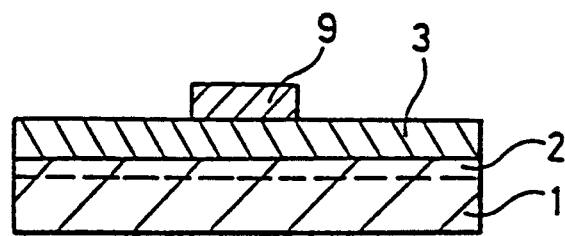
FIG.8 (a) PRIOR ART
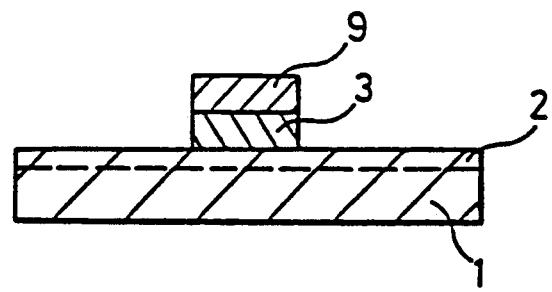
FIG.8 (b) PRIOR ART
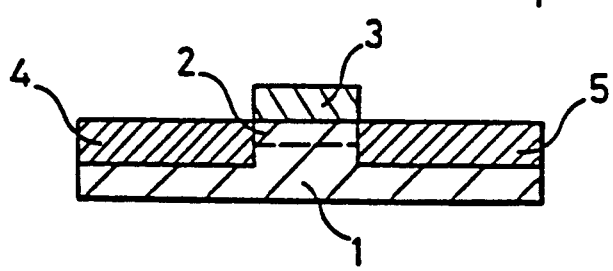
FIG.8 (c) PRIOR ART
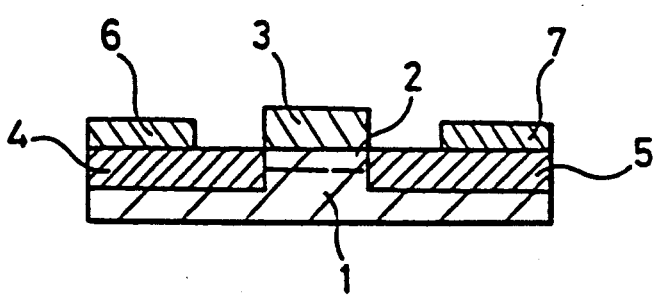
FIG.8 (d) PRIOR ART FIG.10.(PRIOR ART)
FIG.10(a) PRIOR ART
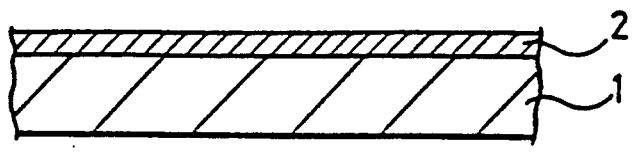
FIG.10(b) PRIOR ART
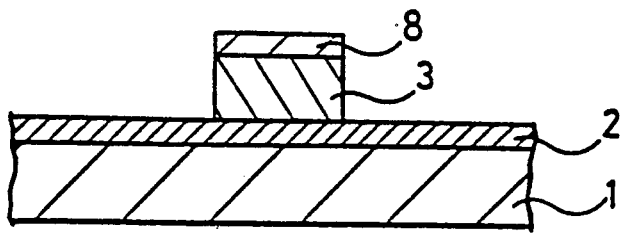
FIG.10(c) PRIOR ART
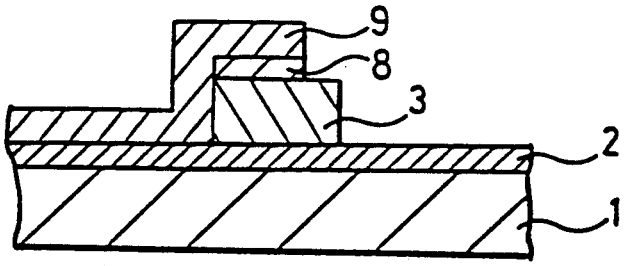
FIG.10(d) PRIOR ART
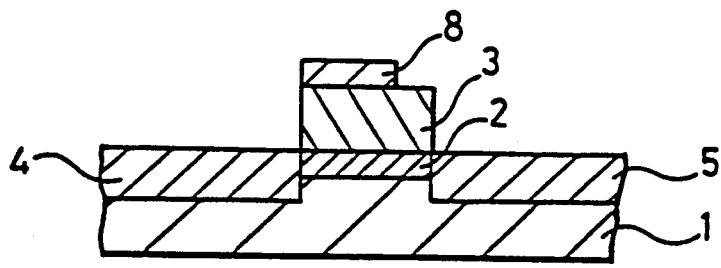
FIG.10(e) PRIOR ART
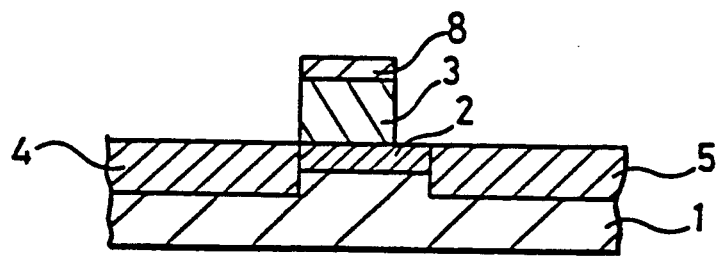
FIG.10(f) PRIOR ART
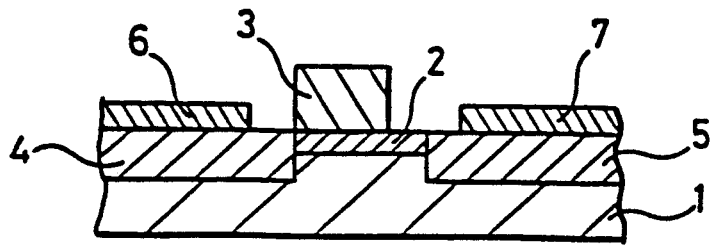

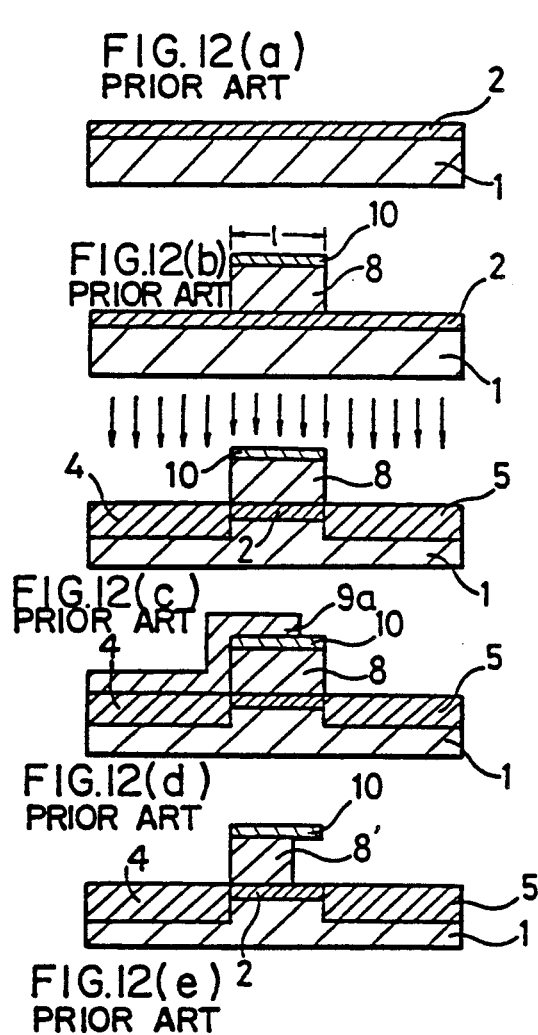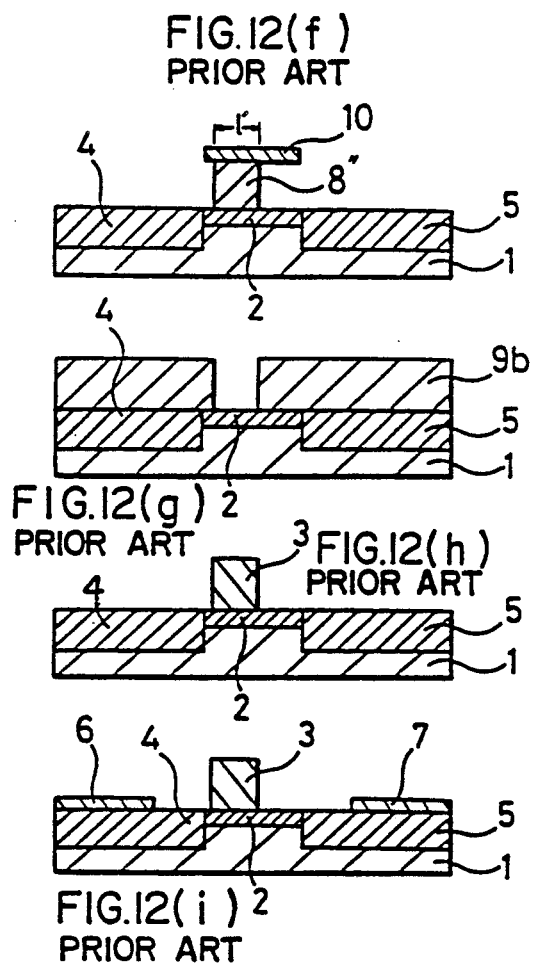

METHOD OF MAKING ASYMMETRICAL GATE FIELD EFFECT TRANSISTOR

FIELD OF THE INVENTION

The present invention relates to a GaAs field effect transistor having a refractory metal gate, and more particularly to a field effect transistor having an offset gate and a production method therefor.

BACKGROUND OF THE INVENTION

Generally, a GaAs Schottky gate type field effect transistor (hereinafter referred to as "GaAs-MESFET") has a high electron mobility and exhibits a superior characteristics as a super high frequency element or a super high speed element. FIG. 6(a) shows an equivalent circuit of a general GaAs-MESFET and FIG. 6(b) shows a construction of a GaAs-MESFET and circuit elements included in this structure.

In FIG. 6(a) and 6(b) reference numerals 15, 16, and 17 designate a source electrode, a gate electrode, and a drain electrode, respectively. When a low noise FET is adopted as a basic FET, the relationship between the equivalent circuit and the minimum noise figure ($F_0$) is:

$$F_0 = 1 + k \cdot f \cdot C_{gs} \sqrt{(R_g + R_s)/g_m} \quad (1)$$

Herein, k is a constant
f is the frequency of operation
Cgs is the gate to source electrode capacitance
Rs is the source resistance
Rg is the gate resistance
gm is the transconductance.

The minimum noise figure is a ratio of the input side S/N (Signal to Noise ratio) to the output side S/N, and the smaller this minimum noise figure is, the better the device efficiency is. It is deduced from formula (1) that to improve the minimum noise figure, the source/gate capacitance Cgs, the source resistance Rs, and the gate resistance Rg should be reduced, and the transconductance gm should be increased.

FIG. 7 shows a cross-section of a field effect transistor having a refractory metal self-aligned gate according to the prior art. This prior art FET starts with a semi-insulating GaAs substrate 1. An active layer 2 is produced at a surface region of the semi-insulating GaAs substrate 1 by ion implantation. A refractory metal silicide gate 3 which produces a Schottky junction with the GaAs substrate 1 is produced on the active layer 2. A source region 4 and a drain region 5 of high doping concentration are produced by ion implantation using the refractory metal silicide gate 3 as a mask. A source electrode 6 and a drain electrode 7 are produced at the surface of the source region 4 and the drain region 5, respectively, in ohmic contact therewith.

The production method of the FET of FIG. 7 will be described with reference to FIGS. 8(a) to (d).

First of all, an active layer 2 is produced at a surface region of the semi-insulating GaAs substrate 1 by ion implantation, a refractory metal silicide layer 3 is applied to the entire surface of the wafer, and a gate pattern is produced using photoresist 9 (FIG. 8(a)).

Next, the refractory metal silicide layer 3 is isotropically etched by reactive ion etching (hereinafter referred to as "RIE") using the photoresist film 9 patterned as described above as a mask, thereby producing a gate electrode 3 (FIG. 8(b)).

Thereafter, ion implantation is conducted using the refractory metal silicide layer 3 as a mask, followed by annealing to produce high concentration doping layers which will become a source region 4 and a drain region 5 (FIG. 8(c)).

Thereafter, a source electrode 6 and a drain electrode 7 are produced by evaporation and lift-off, thereby completing the FET of FIG. 7 (FIG. 8(d)).

In the prior art FET shown in FIG. 7, the drain region 5 and the refractory metal silicide gate 3 are adjacent to each other. This arrangement lowers the breakdown voltage between the gate and drain, reduces reliability, and makes it difficult to apply the FETs to high power analogue integrated circuits (ICs).

In view of such problems, a device of following structure is proposed. FIG. 9 shows an FET disclosed in Japanese Patent Publication No. 62-86870. FIGS. 10(i a) to 10(f) show major production process steps for producing the FET of FIG. 9. In these figures, the same reference numerals designate the same elements as those shown in FIG. 7.

The production method of the device of FIG. 9 will be described with reference to FIG. 10.

Silicon ions are implanted into a semi-insulating GaAs substrate 1 by ion implantation, thereby producing an active layer 2 which becomes a channel region (FIG. 10(a)).

Then, a refractory metal silicide 3 is vacuum evaporated on the surface of the active layer 2, an insulating film 8 comprising SiO$_2$ is deposited on the refractory metal silicide layer 3 by a chemical vapor deposition (CVD) method, and the refractory metal silicide layer 3 and the insulator film 8 are given a length corresponding to the source-drain distance by conventional photolithography processes (FIG. 10(b)).

Next, the source sides of the refractory metal silicide layer 3 and the insulator film 8 are covered by photoresist 9, and a portion of the insulator film 8 on the refractory metal silicide layer 3 is removed with using the photoresist 9 as a mask.

Next, the photoresist 9 is removed and silicon ions are injected utilizing ion implantation (FIG. 10(d)).

Next, the refractory metal silicide layer 3 is etched using the insulator film 8 as a mask, thereby to produce a gate electrode 3. A source region 4 and a drain region 5 are produced by thermal processing in an arsenic ambient (FIG. 10(e)).

Next, ohmic electrodes comprising Au-Ge are produced on the source region 4 and the drain region 5 utilizing conventional photolithography processes, thereby producing a source electrode 6 and a drain electrode 7. The insulator film 8 is removed to complete the FET of FIG. 9 (FIG. 10(f)).

In the FET having the structure shown in FIG. 9, a predetermined distance is provided between the electrode 3 comprising a refractory metal silicide and the drain region 5, which results in a high gate to drain breakdown voltage.

In the FET shown in FIGS. 7 and 9, however, source region 4 is produced adjacent the refractory metal silicide gate 3, thereby resulting in the likelihood of short-circuiting between the source region 4 and the gate electrode 3. In addition thereto, since the gate electrode 3 is provided adjacent the source region 4, impurities implanted into the source region 4 are likely to intrude into the region below the gate electrode 3 by diffusing in a transverse direction during the annealing process for activating impurities implanted into the source region 4. This impurity diffusion shrinks the depletion layer below the gate electrode 3 and increases the gate-source capacitance Cgs and the minimum noise figure.

Such problems are solved by the device having the following structure. FIG. 11 shows an FET disclosed in the Japanese Patent Publication No. 62-86869 and FIGS. 12(a) to 12(i) show major production process steps therefor. In these figures, reference numeral 1 designates a semi-insulating GaAs substrate, numeral 2 designates an active layer comprising an n-type semiconductor layer, numeral 3 designates a gate electrode, numeral 4 designates a source region, numeral 5 designates a drain region, numeral 6 designates a source electrode, numeral 7 designates a drain electrode, numerals 8, 8', and 8" designate SiO$_2$ films, numerals 9a and 9b designate photoresists, and numeral 10 designates a Si$_3$N$_4$ film.

The production process will be described.

Silicon ions are implanted into the semi-insulating GaAs substrate 1 by ion implantation and thereafter, annealing is carried out to produce an active layer 2 which will become a channel region (FIG. 12(a)).

Thereafter, a SiO$_2$ film 8 as a first insulator film is produced on the surface of the active layer 2. A Si$_3$N$_4$ film 10 as a second insulator film is produced on the SiO$_2$ film 8. Both films 8 and 10 are deposited by a Plasma Vapor Deposition (PVD) method (FIG. 12(b)). In an example, the film thickness of the SiO$_2$ film 8 is 4000 Å, and the film thickness of the Si$_3$N$_4$ film 10 is 1000 Å and the distance l is 2 μm. Silicon ions are implanted with using the SiO$_2$ film 8 and the Si$_3$N$_4$ film 10 as a mask for selective ion implantation, and annealing in the arsenic ambient is carried out, thereby producing high concentration n-type semiconductor regions as a source region 4 and a drain region 5 (FIG. 12(c)).

Next, the SiO$_2$ film 8 and the Si$_3$N$_4$ film 10 at the side of the source region 4 are covered by photoresist 9a (FIG. 12(d)), and the SiO$_2$ film 8 is etched by 0.8 μm from the side of the drain region 5 by a hydrogen fluoride (HF) etchant, thereby producing a SiO$_2$ film 8' (FIG. 2(e)). Then, the Si$_3$N$_4$ film 10 is not etched.

Thereafter, the photoresist film 9a is removed, the SiO$_2$ film 8' is again etched by 0.4 μm from the both sides of source and drain region by a hydrogen fluoride (HF) etchant, thereby producing a SiO$_2$ film 8" of length l' which is equal to 0.4 μm (FIG. 12(f)).

Next, the Si$_3$N$_4$ film 10 is removed, the photoresist 9b is deposited, the surface of the SiO$_2$ film 8" is exposed, etching the photoresist 9b in an oxygen plasma. Then the SiO$_2$ film 8" is removed by an HF etchant (FIG. 12(g)).

Thereafter, gate metal is evaporated onto the structure and removed from undesired areas utilizing the photoresist film 9b and the lift-off technique, thereby producing a gate electrode 3 which may be aluminum (FIG. 12(h)).

Ohmic electrodes comprising Au-Ge are produced on the source region 4 and the drain region 5 by conventional photolithography and lift-off techniques to become a source electrode 6 and a drain electrode 7, thereby completing the FET of FIG. 11 (FIG. 12(i)).

As is apparent from FIG. 11, the source region 4 and the drain region 5 are arranged asymmetrically with respect to the gate electrode 3. A predetermined interval is provided between the source region 4 and the gate electrode 2, which results in a high gate to drain breakdown voltage. Furthermore, there is no likelihood that the gate electrode 3 and the source region 4 will be short-circuited as in the prior art examples of FIGS. 7 and 9. The source-gate capacitance Cgs can also be made small, resulting in an FET having a low minimum noise figure.

These prior art production methods for FETs shown in FIGS. 10(a) to 10(f) and FIGS. 12(a) to 12(i) include steps for producing a photoresist film on a gate electrode via an insulator film using photolithography. These steps require precision alignments in the photolithography processes. The precision of alignment needed is generally ±0.5 μm. Even if the threshold voltage is determined at a predetermined voltage and the gate length design is previously determined on the basis of that value, the gate length can seldom be produced at the design value. Especially when the gate length is desired to be reduced to about 1 μm for high speed and high frequency properties of, there is the possibility that the gate length will vary within the range of 0.5 to 1.5 μm with the above described alignment precision. Generally, a relationship shown in FIG. 14 is established between the threshold value and the gate length of a transistor. When the gate length is shortened as shown in the drawing, the threshold voltage shifts toward the minus side, thereby producing the short channel effect. This short channel effect is particularly seen when the gate length is below 1 μm, resulting in a problem in the patterning of the gate length.

In the prior art production method for FETs shown in FIGS. 12(a) to 12(i), a gate electrode 3 is produced by defining a configuration of a gate electrode with an insulator film 8" (FIG. 12(f)), plating a photoresist film 9b and removing an SiO$_2$ film 8" with an HF etchant (FIG. 12(g)), and producing the gate electrode 3 by a lift-off method with utilizing the photoresist 9b as a mask. Accordingly, the gate electrode 3 material must have a melting point such that the photoresist 9b does not degenerate even when the electrode material is vapor plated on the photoresist 9b. Accordingly, Pt (melting point is 1772° C.), Al (melting point is 660.4° C.), or materials having lower melting points are suitable. On the contrary, W or WSi having melting points that are higher than that of Pt cannot be used. WSi$_x$ cannot be used because it is difficult to vapor deposit.

Furthermore, removing SiO$_2$ film 8" with an HF etchant has inferior controllability due to the high etching rate of the HF etchant.

SUMMARY OF THE INVENTION

An object of the present invention is to provide a high precision refractory metal self-aligned gate type field effect transistor capable of reducing a source resistance, gate resistance, and gate to source capacitance yet having a high gate to drain breakdown voltage.

An object of the present invention is to provide a method of producing such an FET.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a refractory metal silicide layer, a refractory inter layer metal film, and a first insulator film are successively produced on an active layer which is produced on a semi-insulating substrate. These three layers are etched at the same time under the same conditions using a resist mask for producing a gate pattern, or are patterned one by one layer under different etching conditions depending on each layer. Ion implantation and annealing are carried out to produce high concentration doping source and drain layers. A second insulator film is deposited on the entire surface of the substrate and etching is conducted by a reactive ion etching having a directionality diagonal to the substrate so that the second insulator film remains on only one side of the gate electrode. Alternatively, a second insulator film is deposited on the substrate to cover one side of the side walls of the gate electrode, the refractory metal silicide film is etched only at one side using the first and second insulator films as masks, thereby producing a gate electrode of an offset structure. Thus, since the gate electrode is offset and the gate to drain distance is lengthened relative to the gate to source distance, the gate to drain breakdown voltage is enhanced while the source resistance and the gate to source capacitance are kept low, thereby obtaining a low minimum noise figure, a high gain, and a high efficiency FET.

According to another aspect of the present invention, an insulator film on the gate electrode of an offset structure produced as described above is removed, a second photoresist film is deposited on the entire surface of the substrate. This photoresist film is etched back until the first insulator film is exposed and the first insulator film is removed. A low resistance metal layer is plated on the refractory metal silicide layer. Thus, since a low resistance metal layer is provided on the gate electrode of an offset structure, the gate to drain breakdown voltage can be raised while the source resistance and gate to source capacitance are kept low and the gate resistance can be reduced, thereby resulting an FET having a high efficiency especially in high frequency operation.

BRIEF DESCRIPTION OF THE DRAWINGS

FIGS. 8(a) to 8(d) are cross-sectional views showing the production process steps for producing the FET of FIG. 7;

FIGS. 10(a) to 10(f) are cross-sectional views showing the production process steps for producing the FET of FIG. 9;

FIGS. 12(a) to 12(i) are cross-sectional views showing production process steps for producing the FET of FIG. 11;

DETAILED DESCRIPTION OF THE PREFERRED EMBODIMENT

An embodiment of the present invention will be described in detail with reference to the drawings.

Figure 1:
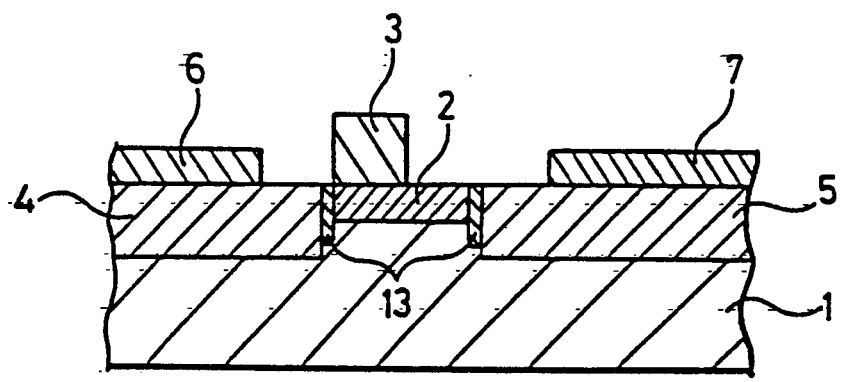
FIG. 1 is a cross-sectional view showing a first FET embodiment according to the present invention.

FIG. 1 is a cross-sectional view showing a first FET according to the present invention. FIGS. 2(a) to 2(j) are cross-sectional views showing production process steps for producing the device of FIG. 1. In these figures, reference numeral 1 designates a semi-insulating GaAs substrate, reference numeral 2 designates an active layer, reference numeral 3 designates a gate electrode comprising tungsten silicide disposed closer to the high concentration source region 4 than to the high concentration drain region 5. Reference numerals 6 and 7 designate a source electrode and a drain electrode both comprising AuGe/Ni/Au, respectively. Reference numeral 8 designates a first insulator film comprising $SiO_2$. Reference numeral 9 designates photoresist, reference numerals 10 and 10a designate second insulator films comprising SiON or $Si_3N_4$, reference numeral 13 designates a low concentration diffusion layer, and reference numeral 14 designates a refractory metal film.

The production process will be described.

First of all, silicon ions are selectively ion implanted into the semi-insulating GaAs substrate 1 with an energy of 30 KeV and to a surface concentration $2.3 \times 10^{12}$ cm$^{-2}$. The implanted substrate is annealed in an arsenic ambient at a temperature of 800° C., for 15 to 45 minutes, thereby producing an active layer 2 (FIG. 2(a)). Next, a refractory metal silicide film 3 such as tungsten silicide (hereinafter referred to as "WSix") is deposited on the entire surface of the GaAs substrate 1 by sputtering or a vapor deposition method. Subsequently a refractory metal film 15 such as tungsten is deposited on film 3 to a thickness of about 100 ↑ by a similar method. An $SiO_2$ film as a first insulator film 8 is deposited on film 15 to a thickness of 5000 Å by plasma CVD method. A pattern defining the gate electrode is formed by photoresist 9 (FIG. 2(b)).

Subsequently thereto, to the $SiO_2$ film 8 is isotropically etched by RIE using a mixture of $CHF_3$ and $O_2$ with the photoresist 9 as a mask. The refractory metal film 15 and refractory metal silicide film 3 comprising such as $WSi_x$ are isotropically etched by RIE using $CF_4$ and $O_2$. Thereafter acid etching is carried out to remove the remainder from dry etching, thereby producing a gate electrode 3 (FIG. 2(c)).

Figure 2:
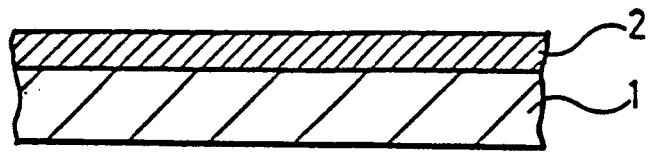
FIGS. 2(a) to 2(j) and FIGS. 3(a) to 3(c) are cross-sectional views showing the major production process steps for producing the FET of FIG. 1.
Figure 2:
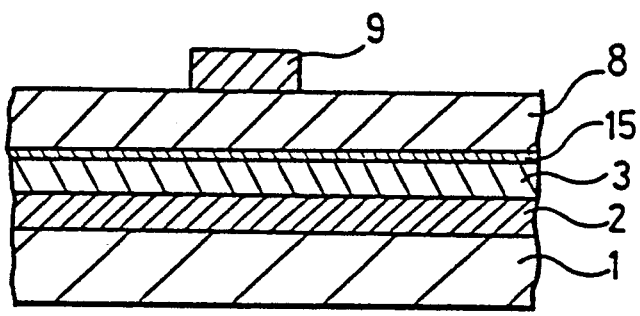
Figure 2:
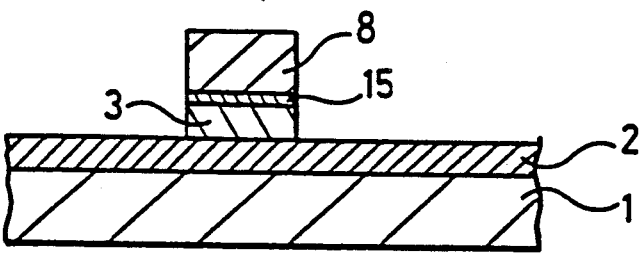
Figure 2D:
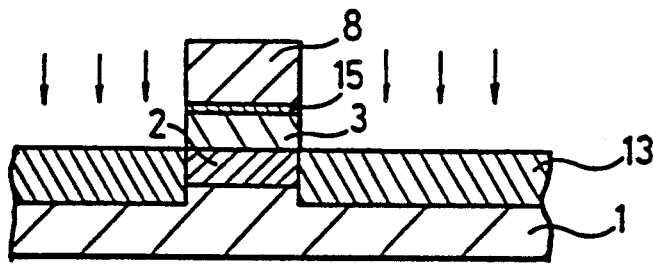

Next, a low concentration layer 13 is produced by implanting silicon ions using the $WSi_x$ film 3, the refractory metal film 15, and $SiO_2$ film 8 as masks (FIG. 2(d)). An insulator film 10a comprising SiON or $Si_3N_4$ is deposited on the entire surface of the substrate. Silicon ions are implanted at an energy of 60 KeV to a surface concentration of $1.0 \times 10^{13}$ cm$^{-2}$. The substrate is annealed in an arsenic ambient at a temperature of 800° C. and for 30 minutes to produce a high concentration source region 4 and a high concentration drain region 5. Then, since the refractory metal film 15 is thin, it is silicided by a reaction with the lower side refractory metal silicide 3 at the annealing temperature (FIG. 2(e)).

Figure 2E:
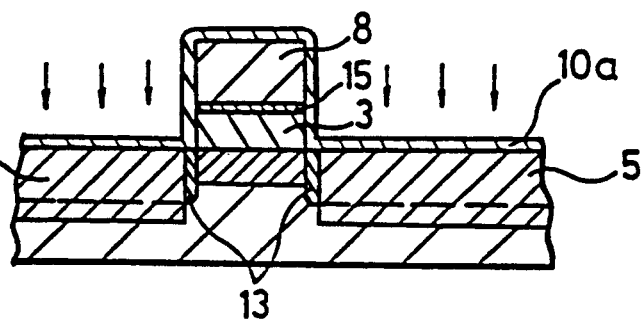
Figure 2F:
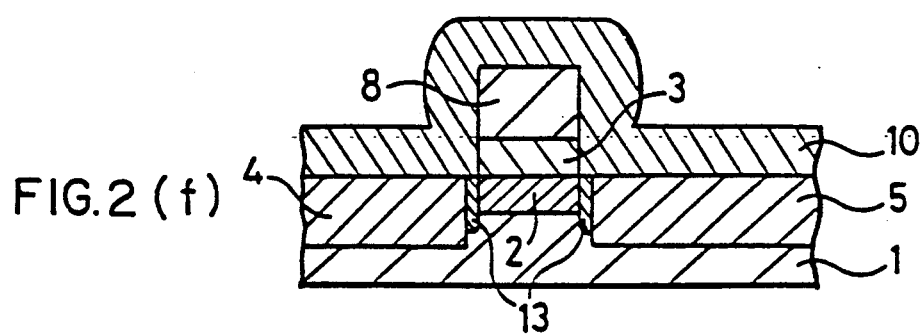

Next, a SiON or $Si_3N_4$ film 10 as a second insulator film is deposited on the GaAs substrate 1 to a thickness of 3000 ↑ by a plasma CVD method (FIG. 2(f)).

Figure 2G:
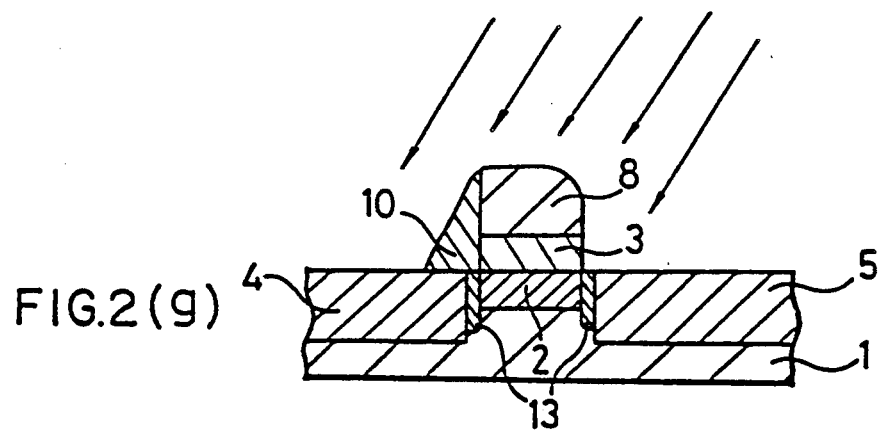

Next, as shown in FIG. 2(g), the second insulator film 10 is etched by a reactive ion flow of $CHF_3$ and $O_2$ which are incident from the diagonal direction relative to the GaAs substrate 1 so that the second insulator film 10 is left only at the side wall of $WSi_x$ 3 at the side of high concentration source region 4. Since the $SiO_2$ film 8 has been annealed, the etching speed is slower by about a factor of three compared to before annealing. Accordingly, the etching selectivity of the second insulator film SiON 10 compared to first insulator film $SiO_2$ 8 is larger than 6, and there is no pattern shift in the $SiO_2$ film 8.

Figure 2H:
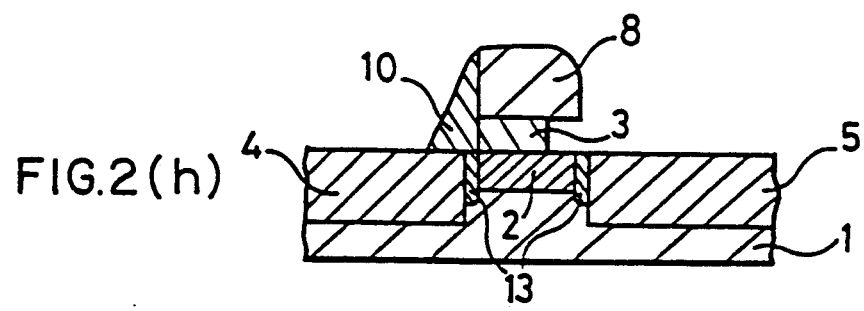
Figure 2I:
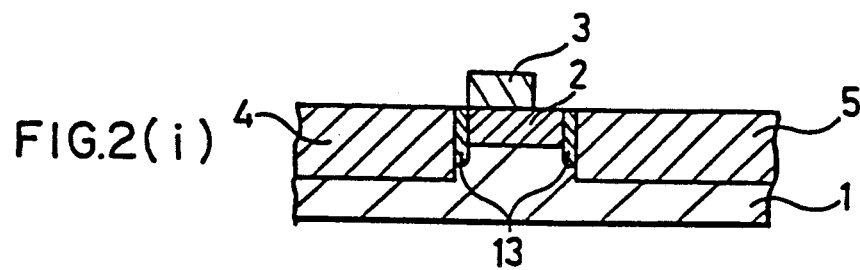
Figure 2J:
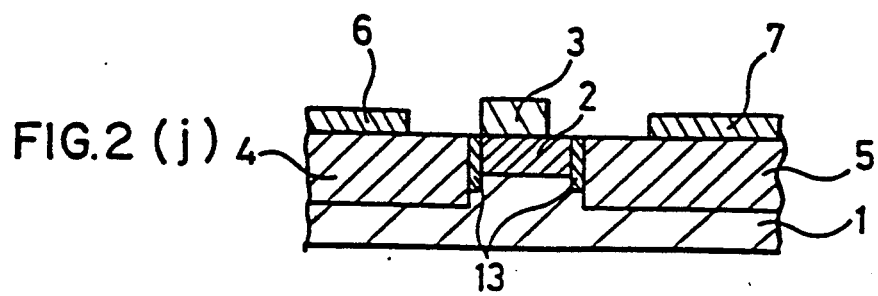

Furthermore, as shown in FIG. 2(h), the $WSi_x$ film 3 is etched only from the side of the high concentration drain region 5 by RIE with $SF_6$ gas or $CF_4+O_2$ gas using the SiON film 10 as a mask. Film 3 is processed to a desired gate length. In this embodiment, about 0.4 $\mu$m of the original gate length is etched. Next, the $SiO_2$ film 8 and the SiON film 10 are removed by a fluorine acid solution.

Subsequently, an AuGe/Ni/Au triple layer structure comprising an AuGe layer of 500 Å, Ni layer of 200 Å and an Au layer of 2000 Å is vapor deposited on the source region 4 and excess deposits are the drain region 5 and lifted off. Thereafter, annealing at a temperature of 400° C. and for 5 minutes is carried out to place the triple layer metal layer in ohmic contact with the source and the drain regions 4 and 5, thereby producing a source electrode 6 and a drain electrode 7 (FIG. 2(i)). As a result, an FET having a structure shown in FIG. 1 is obtained.

Figure 3:
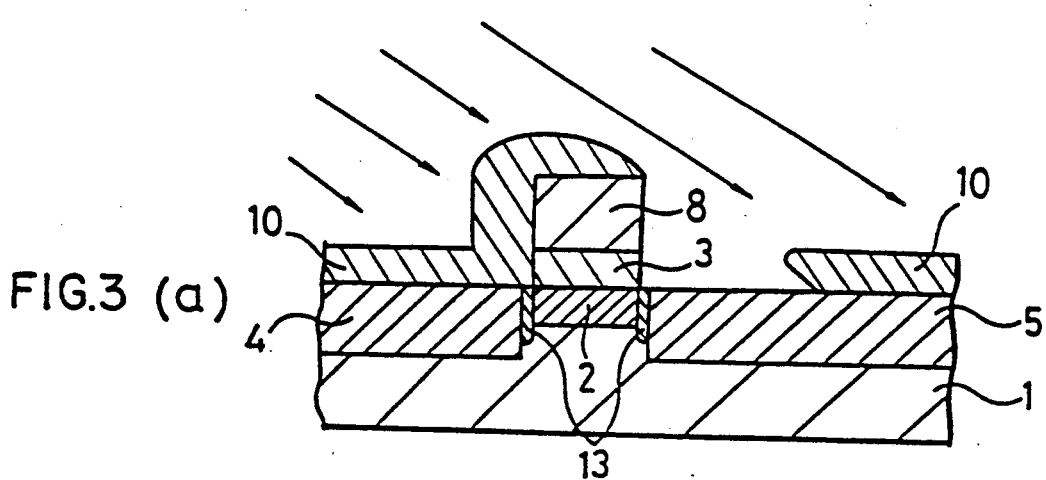
Figure 3B:
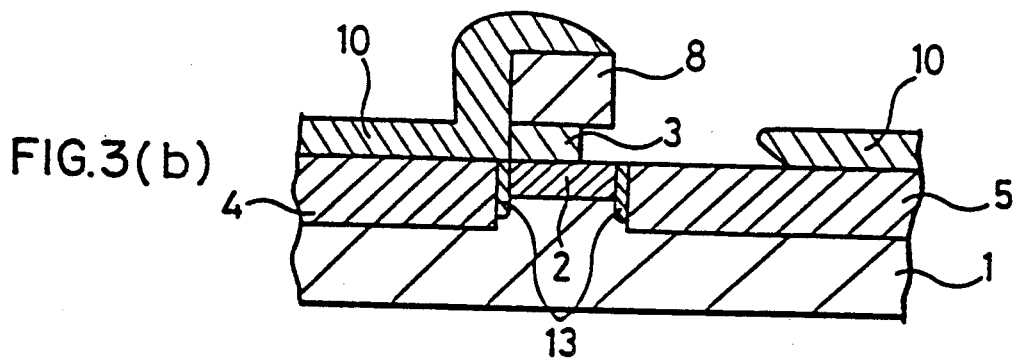
Figure 3C:
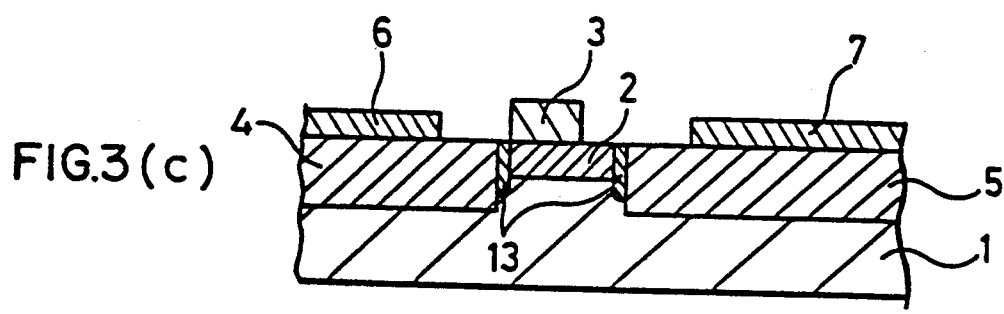

FIGS. 3(a) to 3(c) show cross-sectional views of the major production processes of another production method of the first embodiment.

The process steps up to FIG. 3(a) are the same as FIGS. 2(a) to 2(e), and an insulator film 10a comprising SiON which has been used for producing the source region 4 and the drain region 5 is removed after the process of FIG. 2(e). A vapor deposition process or a plasma CVD process utilizing an electron cyclotron resonance (ECR) having no substrate bias, but having diagonal directionality, is utilized to deposit SiON film 10 only at the side wall of the high concentration source region 4 side (FIG. 3(a)). In the plasma CVD process utilizing ECR having no substrate bias, since a bias is not applied to the substrate, ions in the plasma are not circulated. Instead, vapor is deposited onto the substrate in the straight direction, thereby depositing the insulator film 10 only at one side of the source region 4 as shown in FIG. 3(a).

Thereafter, the $WSi_x$ film 3 is etched only at the side of the high concentration drain region 5 using the SiON film 10 as a mask as in the above described production method (FIG. 3(b)). Thereafter, the $SiO_2$ film 8 and the SiON film 10 are removed and the source electrode 6 and the drain electrode 7 are deposited, thereby completing an FET having an offset gate structure shown in FIG. 1.

In this first embodiment, since the offset gate electrode 3 is produced without using photolithography, there arises no problem such as precision in the alignment of the photoresist film, thereby resulting in a highly precise gate length, less than $\mu$m, without producing variations in the gate length.

Furthermore, in the invention the gate electrode is produced from the gate electrode material that is present from the beginning, which is different from depositing a gate pattern on an insulator film and thereafter replacing the insulator film with gate electrode material using a lift-off method. Accordingly, instead of Pt, Al, or $MoSi_x$, other metals and alloys such as W, $WSi_x$, or WN having higher melting points than those can be applied.

In the gate pattern production method described above, a refractory metal silicide layer 3 is deposited on the GaAs semiconductor substrate 1, a refractory metal film 15 and a first insulator film 8 are successively deposited thereon. Thereafter, the triple layer film on the GaAs semiconductor substrate 1 is patterned. Accordingly, abnormal etching at the interface between the refractory metal silicide film 3 and the insulator film 8 by dry etching can be prevented and abnormal etching of the insulator film 8 at the interface can also be prevented when using acid after the dry etching processing. Thereby, the refractory metal silicide film can be processed with high precision.

Furthermore, the gate electrode 3 is offset i.e., a predetermined minute interval is provided between the source region 4 and the gate electrode 3. A distance is also provided between the gate electrode 3 and the drain region 6. Accordingly, the source resistance and source to gate capacitance can be reduced, and gate to drain breakdown voltage can be high, whereby a low minimum noise figure and high gain FET can be obtained.

Figure 4:
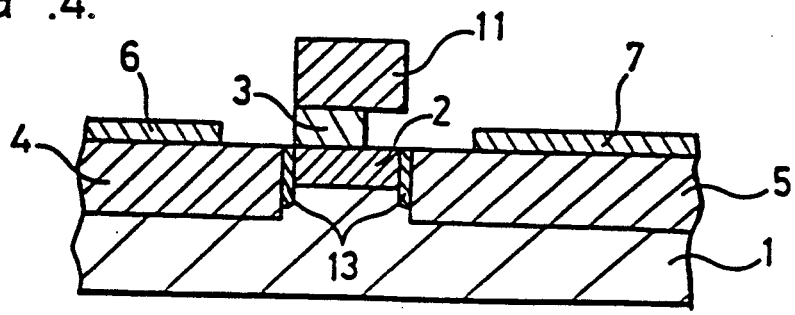
FIG. 4 is a cross-sectional view showing a second FET embodiment according to the present invention.

FIG. 4 shows a cross-section of an FET according to a second embodiment of the present invention. The FET of FIG. 4 has a low resistance metal layer structure disposed on a refractory metal gate. In FIG. 4, the same reference numerals as those of FIG. 1 designate the same or corresponding elements. Reference numeral 11 designates a low resistance metal layer structure comprising Ti (100 Å)/Mo (300 Å/Au (3000 Å).

The production method of this device will be described with reference to FIGS. 5(a) to 5(f), which show the major production process steps thereof.

Figure 5:
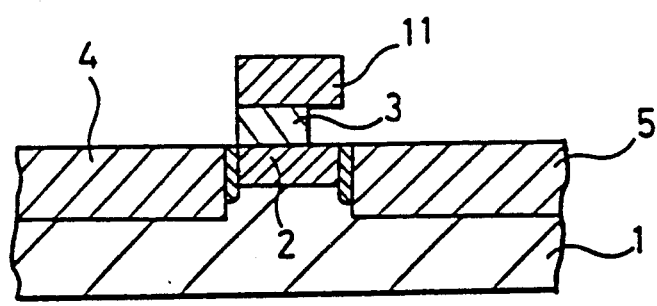
FIGS. 5(a) to 5(f) are cross-sectional views of major production process steps for producing the FET of FIG. 4.
Figure 5:
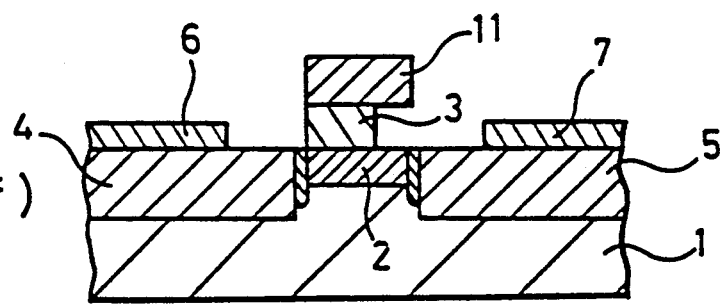
Figure 6:
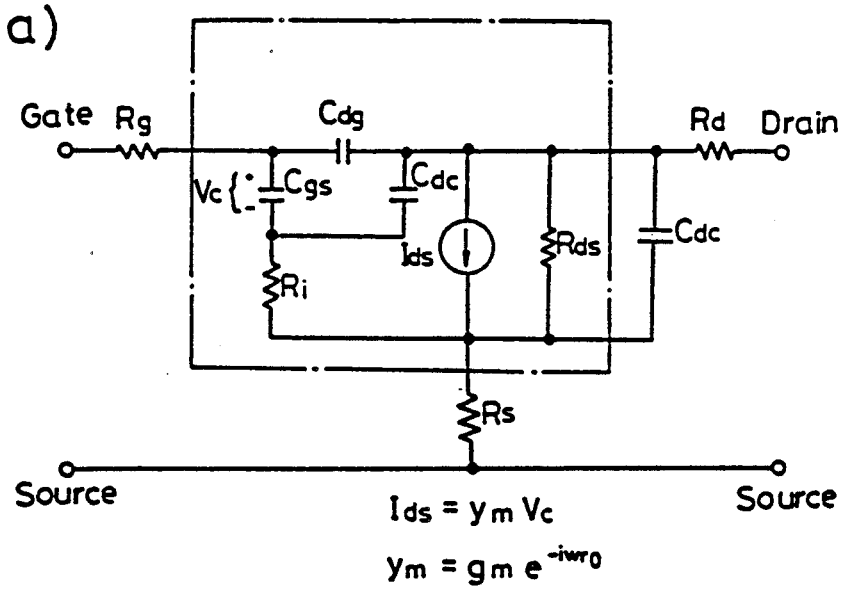
FIG. 6(a) is a diagram showing an equivalent circuit of a GaAs FET and FIG. 6(b) is a diagram showing circuit elements included in the construction of a GaAs FET.
Figure 6:
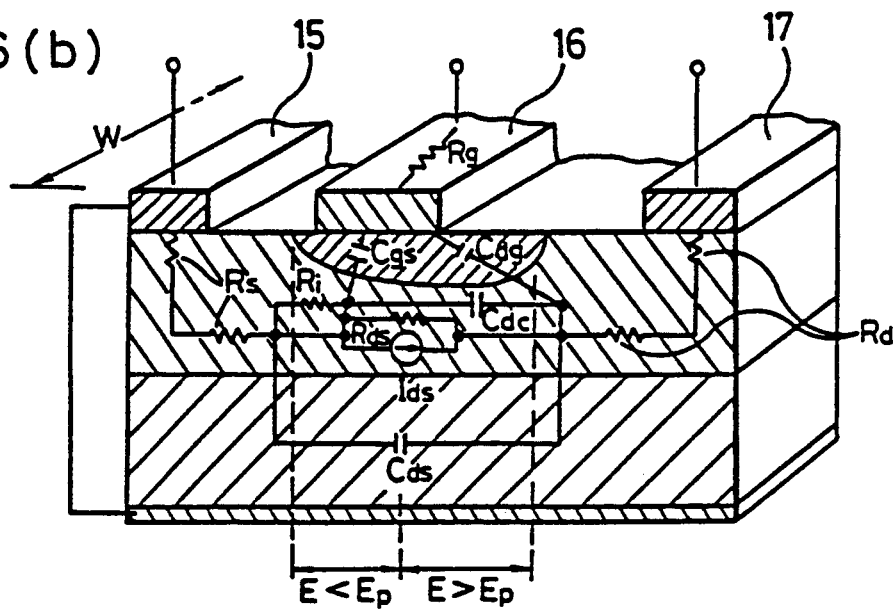
Figure 7:
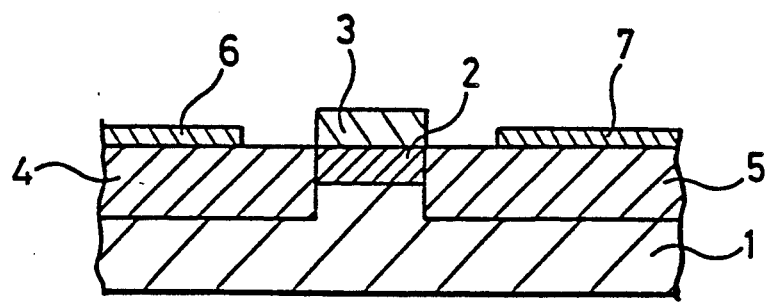
FIG. 7 is a cross-sectional view showing a first FET according to the prior art.
Figure 9:
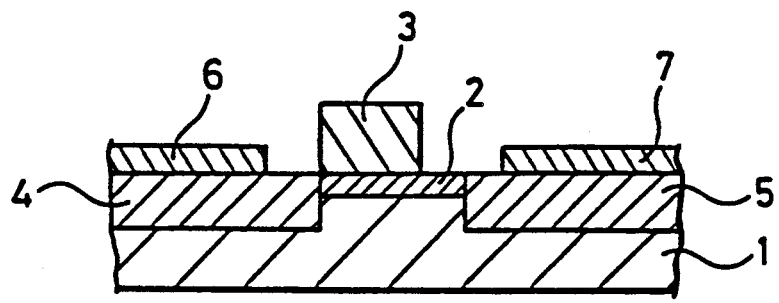
FIG. 9 is a cross-sectional view showing a second FET according to the prior art.
Figure 11:
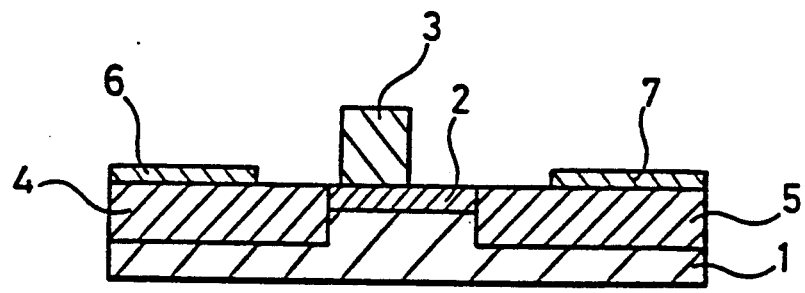
FIG. 11 is a cross-sectional view showing a third FET according to the prior art.
Figure 13:
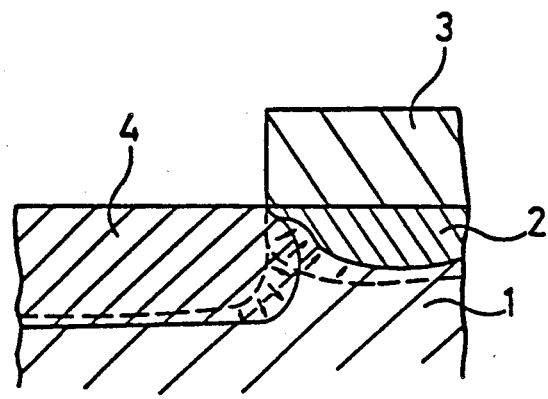
FIG. 13 is a diagram showing diffusion caused by annealing for producing the high concentration diffusion layer.
Figure 14:
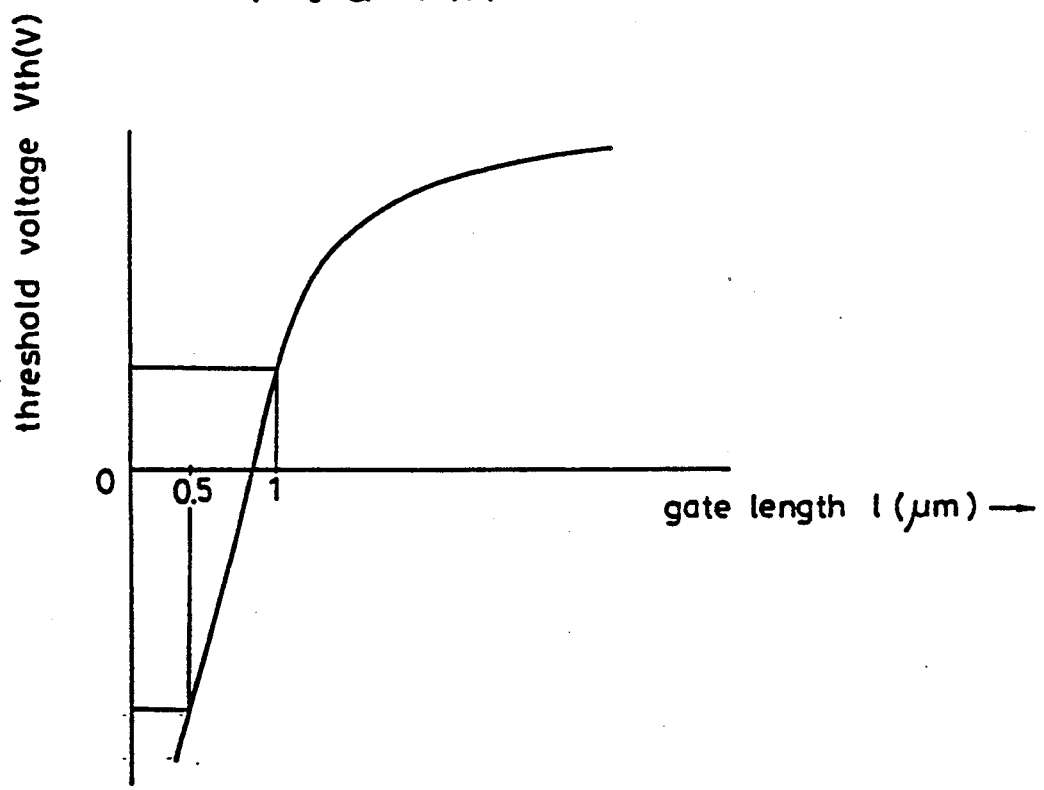
FIG. 14 is a diagram showing the relationship between the gate length and threshold voltage of an FET.

The production process steps up to FIG. 5(a) are the same as those of FIGS. 2(a) to 2(h) or FIGS. 3(a) to 3(b). In this embodiment, after the process step of FIG. 2(h) or FIG. 3(b), the SiON film 10 is selectively removed with a fluorine acid solution. In this case, the $SiO_2$ film 8 has been annealed, thereby resulting in an etching rate that is about 1/10 of that of SiON film 10, and therefore little etching of film 8 occurs (FIG. 5(a)). Next, photoresist 12 is deposited on the entire surface of the semi-insulating GaAs substrate 1 (FIG. 5(b)). Subsequently, the photoresist 12 is etched by reactive ion etching with $O_2$ until the $SiO_2$ film 8 is exposed at the surface (FIG. 5(c)).

Next, the $SiO_2$ film 8 is removed by etching with a fluorine acid solution as shown in FIG. 5(d). Furthermore, a low resistance metal layer structure 11 comprising Ti (100 Å)/Mo (300 Å)/Au (3000 Å) is deposited on the WSix film 3 by vapor deposition and lift-off method (FIG. 5(e)).

Thereafter, a source electrode 6 and a drain electrode 7 are produced thereby to obtain a field effect transistor having a low resistance and an offset gate (FIG. 5(f)). In the second embodiment, almost the same effects as those of the first embodiment are obtained. In addition thereto, since a low resistance metal layer 11 such as Au is plated on the refractory metal silicide layer 3, the resistance of the gate electrode 3 can be reduced to a great extent, thereby raising the upper limit of the operational frequency to about 26 GHz. In the first embodiment, the upper limit of the operational frequency is 2 to 3 GHz.

Table 1 shows the values of gain and minimum noise figure of the conventional self-aligned gate FET and the FET having gold plated refractory metal gate according to the second embodiment of the present invention at a variety of frequencies. It is apparent from the table 1 that the minimum noise figure can be reduced and a high gain obtained in the second embodiment even at a high frequency.

TABLE 1

| | operational frequency | conventional self-aligned gate FET | second embodiment of the present invention (FET having gold attached) |
|---|---|---|---|
| gain | 1 GHz | 24 dB | 24 dB |
| | 12 GHz | 0 dB | 13 dB |
| | 26 GHz | 0 dB | 10 dB |
| minimum noise figure | 12 GHz | 3 ~ 5 dB | ~1 dB |

As is evident from the foregoing description, according to the present invention, a gate electrode comprising a refractory metal silicide is offset, and the source resistance and gate to source capacitance are low, and the gate to drain breakdown voltage is high, thereby resulting in a low minimum noise figure, high gain and high efficiency.

According to another aspect of the present invention, a low resistance metal layer is produced on a gate electrode comprising a refractory metal silicide in an FET having an offset gate structure. The source resistance, gate to source capacitance, and a gate resistance can be reduced and the gate to drain breakdown voltage can be high, thereby resulting in a high gain and high efficiency FET having a low minimum noise figure even at high frequencies.

What is claimed is:

1. A method of producing a field effect transistor having an offset refractory metal silicide gate comprising:
    forming an active layer in a semi-insulating substrate;
    depositing a refractory metal silicide layer, a refractory metal film, and a first insulator film successively on the active layer;
    forming a pattern on the deposited layers with a resist film for etching at least one of the layers;
    forming a refractory metal silicide gate by removing part of the layers;
    ion implanting impurities into the substrate to produce a source and a drain using the layers as a mask and annealing the substrate;
    depositing a second insulator film on the entire surface of the substrate and etching to leave the second insulator film in place only at one side of the gate by reactive ion etching obliquely to the substrate;
    etching only at one side of said refractory metal silicide film using said first and second insulator films as masks; and
    depositing source and drain electrodes after removing said first and second insulator films.

2. A method of producing a field effect transistor having an offset refractory metal silicide gate covered with a low resistance metal layer comprising:
    forming an active layer in a semi-insulating substrate;
    depositing a refractory metal silicide layer, a refractory metal film, and a first insulator film on the active layer;
    forming a pattern on the deposited layers with a first photoresist film for etching at least one of the layers;
    forming a refractory metal silicide gate by removing part of the layers;
    ion implanting impurities into the substrate to produce a source and a drain using the layers as a mask and annealing the substrate;
    depositing a second insulator film on the entire surface of the substrate and etching to leave the second insulator film in place only at one side of the gate by reactive ion etching having a directionality diagonal to the substrate;
    etching only at one side of said refractory metal silicide film using said first and second insulator films as masks;
    removing said second insulator film, depositing a second photoresist film on the entire surface of the substrate, and etching the second photoresist film until the first insulator film is exposed;
    removing the first insulator film and depositing a low resistance metal layer on the refractory metal silicide layer; and
    removing the second photoresist film and depositing a source electrode and a drain electrode.

3. A method of producing a field effect transistor having an offset refractory metal silicide gate comprising:
    forming an active layer in a semi-insulating substrate;
    depositing a refractory metal silicide layer, a refractory metal film, and a first insulator film successively on the active layer;
    forming a pattern on the deposited layers with a resist film for etching at least one of the layers;
    forming a refractory metal silicide gate by removing part of the layers;
    ion implanting impurities into the substrate to produce a source and a drain using the layers as a mask and annealing the substrate;
    depositing a second insulator film covering only one of the sides of the gate;
    etching only at one side of said refractory metal silicide film using said first and second insulator films as masks; and
    depositing source and drain electrodes after removing said first and second insulator films.

4. A method of producing a field effect transistor having an offset refractory metal silicide gate covered with a low resistance metal layer comprising:
    forming an active layer in a semi-insulating substrate;
    depositing a refractory metal silicide layer, a refractory metal film, and a first insulator film on the active layer;
    forming a pattern on the deposited layers with a first photoresist film for etching at least one of the layers;
    forming a refractory metal silicide gate by removing part of the layers;
    ion implanting impurities into the substrate to produce a source and a drain using the layers as a mask and annealing the substrate;

depositing a second insulator film covering only one of the sides of the gate;

etching only at one side of said refractory metal silicide film using said first and second insulator films as masks;

depositing a second photoresist film on the entire surface of the substrate, and etching the second photoresist film until the first insulator film is exposed;

removing the first insulator film and depositing a low resistance metal layer on the refractory metal silicide layer; and removing the second photoresist film and depositing a source electrode and a drain electrode.

* * * * *